United States Patent [19]

Bright et al.

[11] Patent Number: 5,241,453
[45] Date of Patent: Aug. 31, 1993

[54] EMI SHIELDING DEVICE

[75] Inventors: Edward J. Bright, Middletown; Jay F. Maltais, Harrisburg; Attalee S. Taylor, Palmyra, all of Pa.

[73] Assignee: The Whitaker Corporation, Wilmington, Del.

[21] Appl. No.: 22,814

[22] Filed: Feb. 24, 1993

Related U.S. Application Data

[63] Continuation of Ser. No. 845,405, Mar. 3, 1992, abandoned, which is a continuation-in-part of Ser. No. 793,769, Nov. 18, 1991, abandoned.

[51] Int. Cl.[5] .............................................. H05K 7/20
[52] U.S. Cl. ................................ 361/704; 174/35 R; 361/816; 439/108; 439/607
[58] Field of Search .............. 174/35 R, 16.3, 51, 174/260; 439/68, 70, 73, 108, 485, 607; 165/80.3, 185; 257/706, 707, 713, 718, 719; 361/383, 386-389, 400, 405, 424

[56] References Cited

U.S. PATENT DOCUMENTS

| | | | |
|---|---|---|---|
| Re. 32,370 | 3/1987 | Bright | 439/68 |
| 4,716,494 | 12/1987 | Bright et al. | 361/386 |
| 4,745,456 | 5/1988 | Clemens | 357/79 |
| 4,841,414 | 6/1989 | Hibino | 361/424 |
| 4,890,199 | 12/1989 | Beutler | 361/424 |
| 5,014,160 | 5/1991 | McCoy, Jr. | 361/424 |
| 5,031,028 | 7/1991 | Galich | 124/16.3 |
| 5,053,924 | 10/1991 | Kurgan | 361/424 |
| 5,124,889 | 6/1992 | Humbert | 361/424 |

OTHER PUBLICATIONS

IERC Bulletin No.: 503 entitled High Speed Microprocessor Heat Dissipators, dated Mar. 1991.

Primary Examiner—Gerald P. Tolin
Attorney, Agent, or Firm—Gerald K. Kita; Robert J. Kapalka

[57] ABSTRACT

Shielding for a socket of an electronics package comprises, a frame (24) with sidewalls (26,30), solder tails (34) along the sidewalls (26,30), resilient cantilever beams (32) for electrically engaging skirts (56) of a heat sink (18), and a retainer (20) having bars (62) covering openings in the heat sink (18) and plates covering cut outs (28) of the shielding device (12).

8 Claims, 3 Drawing Sheets

EMI SHIELDING DEVICE

CROSS REFERENCE TO RELATED APPLICATION

This application is a continuation of application Ser. No. 07/845,405 filed Mar. 3, 1992, now abandoned, which is a continuation in part of application Ser. No. 07/793,769, filed Nov. 18, 1991, abandoned.

FIELD OF THE INVENTION

The invention disclosed herein relates to devices that shield high frequency very large scale integrated packages mounted on a substrate.

BACKGROUND OF THE INVENTION

It is well known that electronic signals within electronic packages such as micro-processors emit electromagnetic energy (EMI) from the package, which causes electrical interference in other electronic signals. It is also believed that electrical sockets in which the packages are positioned also emit EMI as the signals from the electronic packages pass through the sockets. The amount of radiation being emitted, if any, is as yet unknown and further varies from one socket construction to another. It is desirable to provide a shield against the emission of EMI. For example, it is well known to shield signal wires; e.g., U.S. Pat. No. 3,775,552 to Schumacher, to shield signal contact elements in two piece connector systems; e.g., U.S. Pat. Nos. 4,846,727 to Glover et al. and U.S. Pat. No. 4,867,690 to Chumma and to make connector encompassing hoods of a shielding material as disclosed in U.S. Pat. No. 4,822,286 to Bionco.

It is further known from U.S. Pat. No. 5,030,115 to Regnier et al. to provide an elongated ground shield across the back faces of a pair of SIMM sockets stacked on top of each other in a socket carrier and further to insert the shield across the back faces of and between two pair of SIMM sockets stacked in a carrier with each pair facing in an opposite direction. The shield prevents electrical interference (EMI and RF) of or by the terminals of the SIMM sockets.

It is now proposed to provide a shielding device adapted to be placed around an electronic package and the socket in which the package is positioned to quell EMI emissions and further to ground a heat sink on the electronic package to prevent it from being an EMI antenna. The device further provides RF shielding for the electronic package and the socket.

Disclosed in U.S. Pat. No. RE 32,370, is a cover for a socket having arms and prying tabs on the arms and on depending members that lock the cover to the socket.

U.S. Pat. No. 4,716,494 discloses a spring clip whose latch sections are latched under latch projections.

SUMMARY OF THE INVENTION

According to the present invention, a shielding device is provided having sidewalls forming a frame to enclose a socket and electronic package in the socket and solder tails for grounding the device to grounding circuits on a substrate on which the device and socket are mounted.

DESCRIPTION OF THE INVENTION

Figure 1:
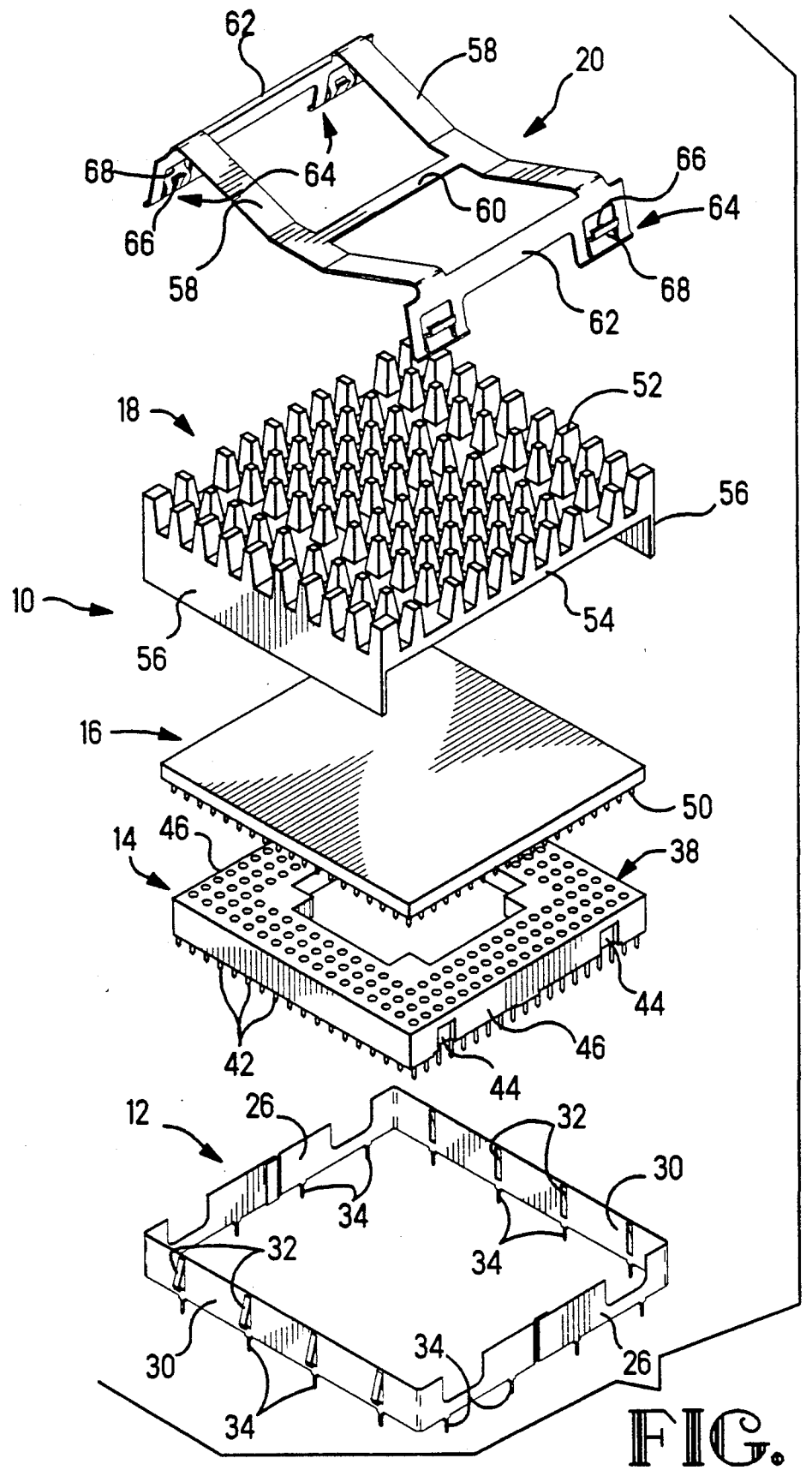
FIG. 1 is an exploded view of an assembly incorporating the shielding device of the present invention, a socket, an electronic package, a heat sink and a retainer.

A typical assembly 10 using shielding device 12 of the present invention is shown in exploded fashion in FIG. 1. The assembly includes socket 14 for receiving electronic package 16. Socket 14 is fully disclosed in U.S. Pat. No. 4,988,310 to Bright et al. and package 16 may be for example a MIPS R 4000 PC 179 PGA, known in the industry. Also included is a heat sink 18 having an electrically insulating thermal interface (not shown) and retainer 20.

Figure 2:
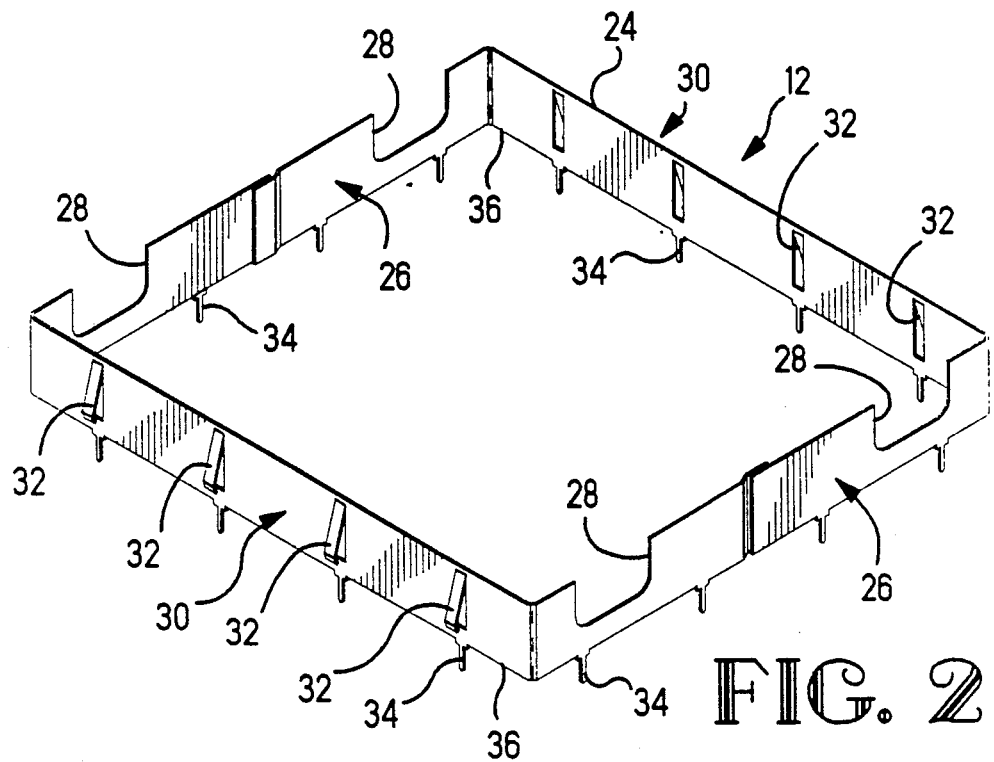
FIG. 2 is a view of the shielding device itself.

As shown in FIG. 2, shielding device 12 is stamped and formed into a frame 24 having required dimensions. Device 12 includes two parallel sidewalls 26 having cut-outs 28 to provide access to retainer 20. Device 12 further includes a second set of parallel sidewalls 30 having cantilevered beams 32 projecting obliquely outwardly from the plane of the walls. All sidewalls 26,30 are provided with solder tails 34 projecting outwardly from edge 36.

Device 12 is stamped and formed from a suitable conductive material such as phosphor bronze or beryllium copper. It can be made in two or more pieces and joined as shown or as a single piece. Dimensions, i.e., length and heights of sidewalls 26,30 are determined by the sizes of socket 14 and heat sink 18. Solder tails 34 may be replaced by other means for electrically connecting device 12 to ground. Such other means (not shown) include leads which are frictionally received in holes in a substrate, solder feet for being surface soldered to circuit pads on a substrate and fasteners such as nuts and bolts.

With reference back to FIG. 1, socket 14 includes a dielectric housing 38 with contact elements (not shown) therein having leads 42 extending outwardly. Latch shoulders 44 are provided on opposite sidewalls 46 of housing 38. Socket 14 is manufactured and sold by AMP Incorporated of Harrisburg, Pa. under the tradenames LIF socket and TAZ socket.

Electronic package 16 includes leads 50 projecting outwardly from a packaged microprocessor.

Heat sink 18 includes cooling towers 52 projecting outwardly from base 54 and skirts 56 extending outwardly from two opposing sides of the base.

Retainer 20 is made from a suitable material having the necessary spring characteristics. It includes parallel, curved side rails 58 joined by middle bar 60 and end bars 62. Further included are latch members 64 having lances 66 and screw driver-tip release catches 68.

Figure 3:
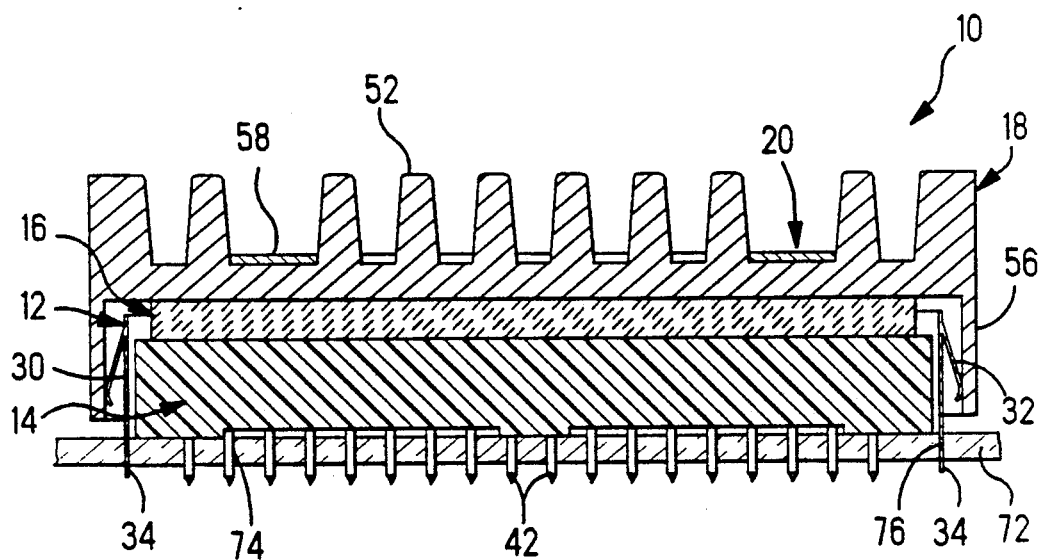
FIG. 3 is a sectioned view of the assembly incorporating the shielding device.

FIG. 3 illustrates assembly 10 mounted on substrate 72. Socket 14 is secured to substrate 72 by contact element-leads 42 being either soldered in substrate holes 74 or frictionally received therein. Leads 42 also electrically engage circuits (not shown) carried by substrate 72. Shielding device 12 surrounds socket 14 and is secured to substrate 72 by tails 34 being soldered in substrate holes 76. Tails 34 also electrically engage ground circuits (not shown) carried by substrate 72.

Electronic package 16 is placed on socket 14 with leads 50 electrically engaging contact elements (not shown) within socket housing 38.

Heat sink 18 is placed over package 16 with a thermal interface or blanket (not shown) therebetween and with skirts 56 extending down the sidewalls 30 of device 12 and engaging cantilevered beams 32 thereon. The engagement between skirts 56 and beams 32 grounds the sink 18 to the ground circuits (not shown) of substrate 72 and prevents it from being an antenna.

Cut-outs 28 provide access to latch members 64 through shielding device 12.

Figure 5:
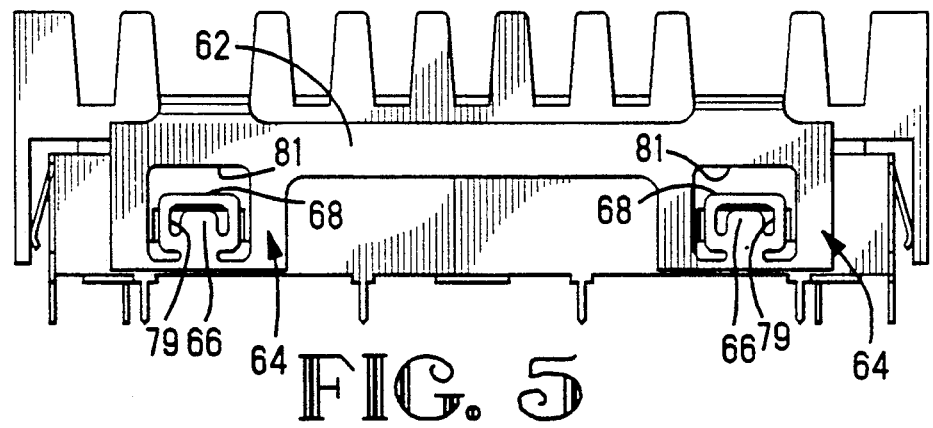
FIG. 5 is an elevation view of the construction shown in FIG. 4.
Figure 6:
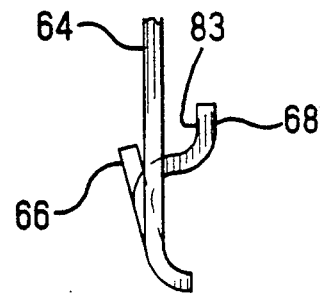
FIG. 6 is a fragmentary view of a catch of a retainer.

Retainer 20 is placed over heat sink 18 with lances 66 on latch members 64 catching on shoulders 44 on socket 14 to retain electronic package 16 and heat sink 18 thereon. Rails 58 and bar 60 lie on base 54 between towers 52. The rails 58 are obverse curved toward the base 54 and are at least partially straightened by being at least partially flattened by engagement against the base 54 to provide a resilient spring bias exerted upward to bias the latch members 64 upward and in pressure engagement against the shoulders 44. The latch members 64 along each of the bars 62 is coplanar with the bars 62. Both the rails 58 are bent where they join the bars 62 to project the bars 62 outwardly from the curved planes of the rails 58, and to project the bars 62 along sides 26 of the frame 12. The bars 62 overlap the frame 24 along the sides 26, and bridge across openings between the skirts 56. The openings are under the base 54 where there are no skirts 56. The bars conductively engage the frame 24. The frame 24 bridges across the openings and provides a conductive shield over the openings. The bars 62 provide a conductive shield over the openings, especially if the openings form gaps between the frame 24 and the base 54 of the heat sink 18. To make the shield even more effective, the bars 62 overlap and conductively engage the base 54 of the heat sink 18. As shown in FIGS. 5 and 6, the latch members 64 comprise flat plates that cover the cut outs 28 in the frame 12. The latch members 64 provide a conductive shield over the cut outs 28, extending across discontinuities in the shield caused by the cut outs 28. The latch members 64 are connected to the remainder of the shield by bridging across the cut outs 28 to engage against the frame 12 on opposite sides of each of the cut outs 28. The latch members 64 have first U shaped slits 79 defining the lances 66 that are bent where joined to the remainder of the latch members 64 to project diagonally inward of the socket 14 for registration under the shoulders 44. The lances 66 are biased upwardly and against the shoulders 44, as described. The latch members 64 have second U shaped slits 81 spaced from the slits 79 and partly circumscribing the slits 79 to define the catches 68 that are shaped like yokes spaced from the lances. Each of the catches 68 is bent outwardly of the lances 66 and of the remainder of the latch member 64 a first time, and then is bent a second time in a reverse direction to the first time, to provide each of the catches 68 with a tool receiving receptacle 83 with an open, upward end projecting outward of the remainder of the latch member 64. The lances 66 form respective sides of the receptacles 83. The lances 66 project inwardly from the remainder of the latch members 64. A screwdriver can be inserted in the receptacle 83. By prying against the receptacle 83 of the catch 68 with the screwdriver, the lance 66 will be removed from the shoulder 44. Preferably, the screwdriver is pressed against a closed bottom of the receptacle 83 of the catch 68 in a downward direction tending to flatten the rails 58 further. The lance 66 will move away from the shoulder 44, permitting the side rails 58 to recover to a more curved shape, and thereby move the lance 66 further away from the shoulder 44. When the lances 66 are removed from the shoulders 44, the retainer 20 becomes released from the socket 14, and can be removed for access to the package 16 for the purposes of repair and replacement.

Figure 4:
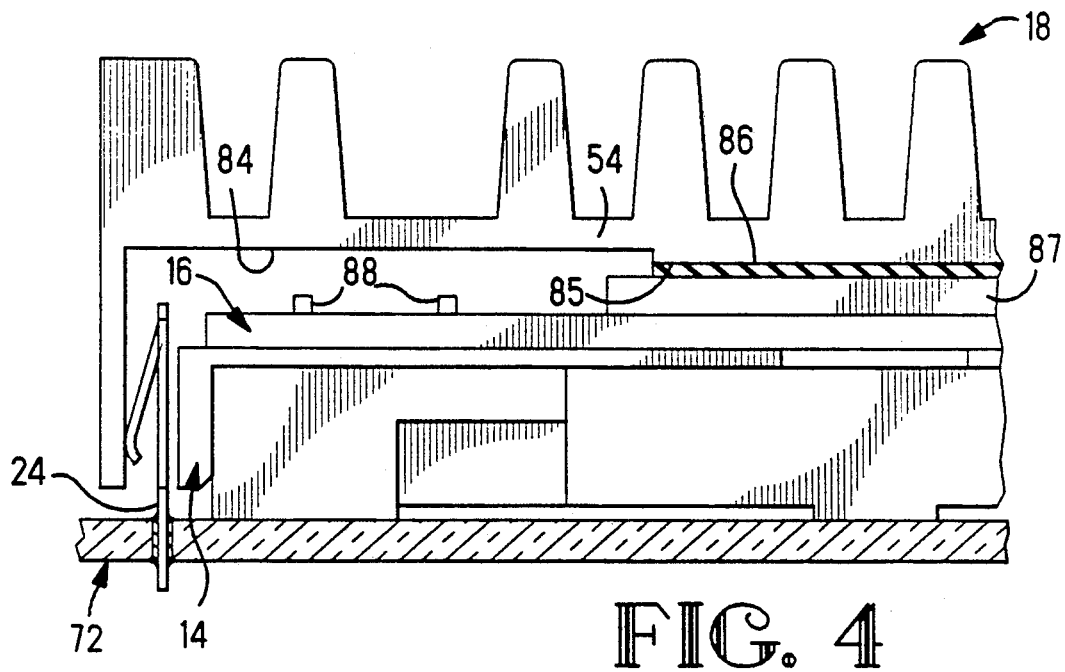
FIG. 4 is a fragmentary section view of an alternative construction of the heat sink, illustrating a thermal blanket.

Disclosed in FIG. 4 is an alternative construction wherein the heat sink 18 includes inverted recessed channels 84 in the base 54 on either side of a projecting pedestal 85 that registers against a thin thermal blanket 86 that is an electrically insulative material such as polyurethane, at the same time being thin enough to be thermally transmissive. The thermal blanket 86, in turn, registers against a thin conductive slug 87 comprising a thermally conducting, elevated top of the package 16. The thermal blanket 86 is compressible to conform to surface irregularities in the pedestal 85 and the slug 87, thereby to assure good heat transfer. The top of the package 16 may also have decoupling capacitors 88 connected to circuitry of the package 16, spaced from the elevated slug 87. The channels 84 provide clearances between the capacitors 88 and the base 54 of the heat sink 18.

Cantilever beams 32 may be replaced with other devices for electrically engaging heat sink 18.

The shielding device 12 has been illustrated as being rectangular. It can be made round or any other desired geometric shape.

As can be discerned from the foregoing discussion, a shielding device to prevent the broadcasting of EMI from an electronic package has been disclosed. The device surrounds the socket and package and is electrically connected to grounding circuits on the substrate on which the assembly is mounted. The shielding device also grounds a heat sink which may be a part of the assembly to prevent it from being an antenna. The shielding device is easily and economically manufactured by well-known stamping and forming methods.

We claim:

1. An electrically shielded electronic assembly, comprising:

a socket including a dielectric housing having electrically conductive contact elements extending to leads at a bottom of the housing for electrical connection with circuits on a substrate;

an electronic package mounted on the socket and having leads in electrical engagement with the contact elements of the socket;

an electrically conductive heat sink disposed over a top of the electronic package in thermally conductive contact therewith;

a retainer having a releasable connection with the socket housing and disposed for retaining the heat sink in the thermally conductive contact; and, an electrically conductive frame closely surrounding peripheral surfaces of the socket and electronic package between the bottom of the housing and the top of the electronic package, the frame being in electrical engagement with the heat sink and having a lead for electrically engaging a ground circuit of the substrate.

2. The shielded electronic assembly according to claim 1, wherein the releasable connection includes the retainer having a resilient latch member which is engaged by a shoulder defined in the socket housing.

3. The shielded electronic assembly according to claim 2, wherein the frame includes a cutout which provides access for operating the releasable connection.

4. The shielded electronic assembly according to claim 3, wherein the latch member bridges across the cutout and electrically connects opposite sides of the cutout.

5. The shielded electronic assembly according to claim 2, wherein the retainer includes a resilient rail engaged against the heat sink for biasing the latch member against the shoulder.

6. The shielded electronic assembly according to claim 1, wherein the heat sink includes a downwardly extending skirt, and the electrical engagement of the frame with the heat sink is provided by the frame defining at least one cantilevered beam which is in contact with the skirt.

7. The shielded electronic assembly according to claim 1, wherein the retainer is electrically conductive, and an end bar of the retainer overlaps a portion of the frame.

8. The shielded electronic assembly according to claim 7, wherein the end bar electrically engages the frame.

* * * * *